(12) United States Patent
Sharan

(10) Patent No.: US 6,756,088 B2
(45) Date of Patent: Jun. 29, 2004

(54) METHODS OF FORMING COATINGS ON GAS-DISPERSION FIXTURES IN CHEMICAL-VAPOR-DEPOSITION SYSTEMS

(75) Inventor: Sujit Sharan, Chandler, AZ (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 09/942,114

(22) Filed: Aug. 29, 2001

(65) Prior Publication Data

US 2002/0094371 A1 Jul. 18, 2002

Related U.S. Application Data

(60) Provisional application No. 60/228,852, filed on Aug. 29, 2000.

(51) Int. Cl.[7] ............................................... C23C 16/50
(52) U.S. Cl. ..................... 427/569; 427/576; 427/237; 427/250; 427/253; 427/255.391; 427/255.394
(58) Field of Search .......................... 427/99, 250, 252, 427/253, 255.391, 255.394, 536, 569, 237; 438/680

(56) References Cited

U.S. PATENT DOCUMENTS

| | | | |
|---|---|---|---|
| 5,751,896 A | 5/1998 | Sandhu et al. | 392/416 |
| 5,892,886 A | 4/1999 | Sandhu | 392/416 |
| 5,946,542 A | 8/1999 | Iyer | 438/7 |
| 6,022,586 A * | 2/2000 | Hashimoto et al. | 427/237 |
| 6,043,450 A | 3/2000 | Sandhu | 219/121.43 |
| 6,051,823 A | 4/2000 | Sandhu | 219/680 |
| 6,064,800 A | 5/2000 | Sandhu | 392/416 |
| 6,136,690 A | 10/2000 | Li | 438/627 |
| 6,232,580 B1 | 5/2001 | Sandhu | 219/390 |
| 6,243,534 B1 | 6/2001 | Sandhu | 392/416 |
| 6,445,023 B1 | 9/2002 | Vaartstra et al. | 257/295 |
| 6,472,309 B1 | 10/2002 | Li | 438/627 |
| 6,503,822 B2 | 1/2003 | Li | 438/617 |
| 6,515,363 B2 | 2/2003 | Li | 257/751 |
| 6,664,159 B2 | 12/2003 | Vaartstra et al. | 438/240 |
| 2002/0094387 A1 * | 7/2002 | Bhan | 427/569 |

* cited by examiner

Primary Examiner—Timothy Meeks
(74) Attorney, Agent, or Firm—Schwegman, Lundberg, Woessner & Kluth, P.A.

(57) ABSTRACT

Integrated circuits are generally built layer by layer on a substrate. One technique for forming layers is chemical vapor deposition (CVD.) This technique injects gases through a gas-dispersion fixture, such as a showerhead, into a chamber. The gases react and blanket a substrate in the chamber with a layer of material. One method of promoting uniform layer thickness is to coat the gas-dispersion fixture with a uniform layer of the material before using the fixture for deposition on the substrate. However, conventional fixture-coating techniques yield uneven or poorly adherent coatings. Accordingly, the inventor devised new methods for coating these fixtures. One exemplary method heats a fixture to a temperature greater than its temperature during normal deposition and then passes one or more gases through the fixture to form a coating on it. The greater conditioning temperature improves evenness and adhesion of the fixture coating, which, in turn, produces higher quality layers in integrated circuits.

28 Claims, 2 Drawing Sheets

> US 6,756,088 B2

METHODS OF FORMING COATINGS ON GAS-DISPERSION FIXTURES IN CHEMICAL-VAPOR-DEPOSITION SYSTEMS

This application claims the benefit of U.S. Provisional Application No. 60/228,852, filed Aug. 29, 2000.

TECHNICAL FIELD

The present invention concerns methods of making integrated circuits, particularly layer-formation methods, such as chemical vapor deposition.

BACKGROUND OF THE INVENTION

Integrated circuits, the key components in thousands of electronic and computer products, are interconnected networks of electrical components fabricated on a common foundation, or substrate. Fabricators generally build the circuits layer by layer, using techniques, such as deposition, doping, masking, and etching, to form thousands and even millions of microscopic resistors, transistors, and other electrical components on a silicon substrate, known as a wafer. The components are then wired, or interconnected, together to define a specific electric circuit, such as a computer memory.

One common technique for forming layers in an integrated circuit is called chemical vapor deposition. Chemical vapor deposition, or CVD, generally entails placing a substrate in a reaction chamber, introducing one or more gases, known as precursor gases, into the chamber, and heating the substrate to prescribed temperatures. The precursor gases enters the chamber through a gas-dispersion fixture, such as a gas ring or a showerhead, one or more centimeters above the substrate and descend toward the heated substrate. The gases react with each other and/or the heated substrate, blanketing its surface with a layer of material having a composition based on the gases.

Because of demands for smaller and smaller integrated circuits, it has become increasingly important that layers, such as those made using chemical vapor deposition, have uniform thickness across the substrate. One method of promoting uniform thickness in chemical vapor depositions is to coat the gas-dispersion fixture with a uniform layer of the material before using the fixture in an actual deposition on a substrate. This method is generally known as conditioning. Conventional conditioning techniques entail running the CVD chamber through several normal deposition cycles (that is, at normal temperatures and pressures) on a test or dummy substrate before using it for actual fabrication.

However, this conventional conditioning technique suffers from at least three problems. First, this technique produces coatings of poor thickness uniformity across gas-dispersion fixtures. In operation, these unevenly coated fixtures disperse gas unevenly and produce uneven depositions. Second, for large fabrication plants with many ideally identical CVD chambers, the coatings vary significantly from fixture to fixture, making it difficult for the CVD chambers to deposit layers of consistent quality. And third, the conventional technique yields coatings that adhere poorly to the gas-dispersion fixtures. Particles from poorly adherent coatings sometimes fall from fixtures onto underlying substrates, causing defects in integrated circuits.

Accordingly, there is a need for better ways of coating or conditioning gas-dispersion fixtures to promote uniform chemical vapor deposition and/or to reduce defects in integrated circuits.

SUMMARY OF THE INVENTION

To address these and other problems, the present inventors devised new procedures for conditioning gas-dispersion fixtures in chemical-vapor-deposition (CVD) chambers. One conditioning procedure, in accord with the invention, entails heating at least a portion of a gas-dispersion fixture, such as a showerhead, to a temperature greater than its temperature during normal deposition operations and then passing one or more gases through the fixture to form a coating on it. Exemplary methods for raising the fixture temperature beyond its normal level include placing the fixture closer to a heated substrate holder than its normal operating position and/or introducing high-powered plasma in the vicinity of the fixture.

Increasing the temperature of the fixture during conditioning promotes uniform coating thickness and coating adhesion to the fixture. These in turn promote uniform chemical vapor depositions and reduce the likelihood of coating particles falling onto underlying substrates and causing integrated-circuit defects.

Other aspects of the invention include conditioning a gas-dispersion fixture at a higher-than-normal temperature, reducing the gas-dispersion fixture temperature, and then using the gas-dispersion fixture at the reduced temperature to form a layer of an integrated circuit.

DESCRIPTION OF THE PREFERRED EMBODIMENTS

Figure 1:
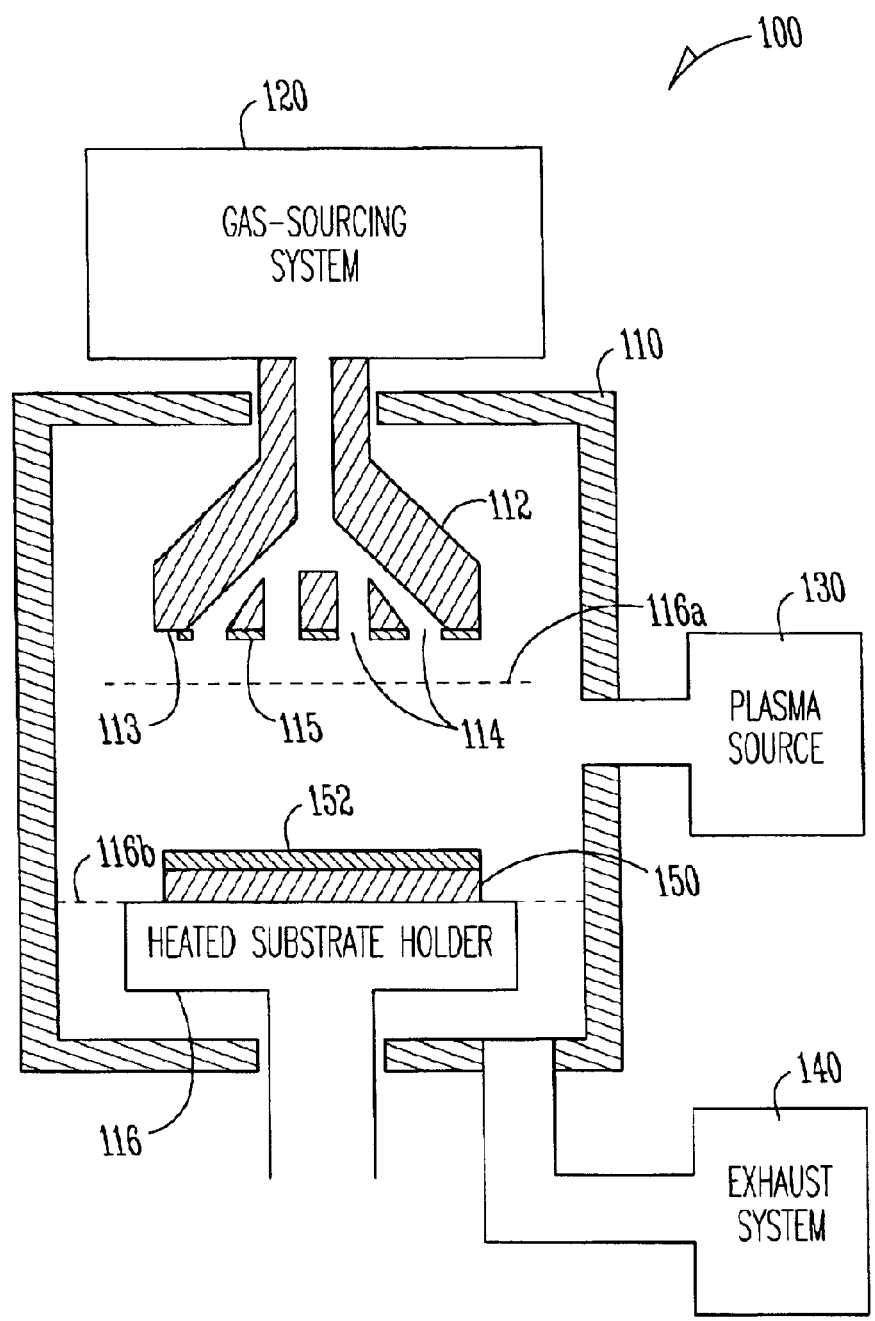
FIG. 1 is a simplified cross-sectional diagram of an exemplary chemical-vapor-deposition system 100.
Figure 2:
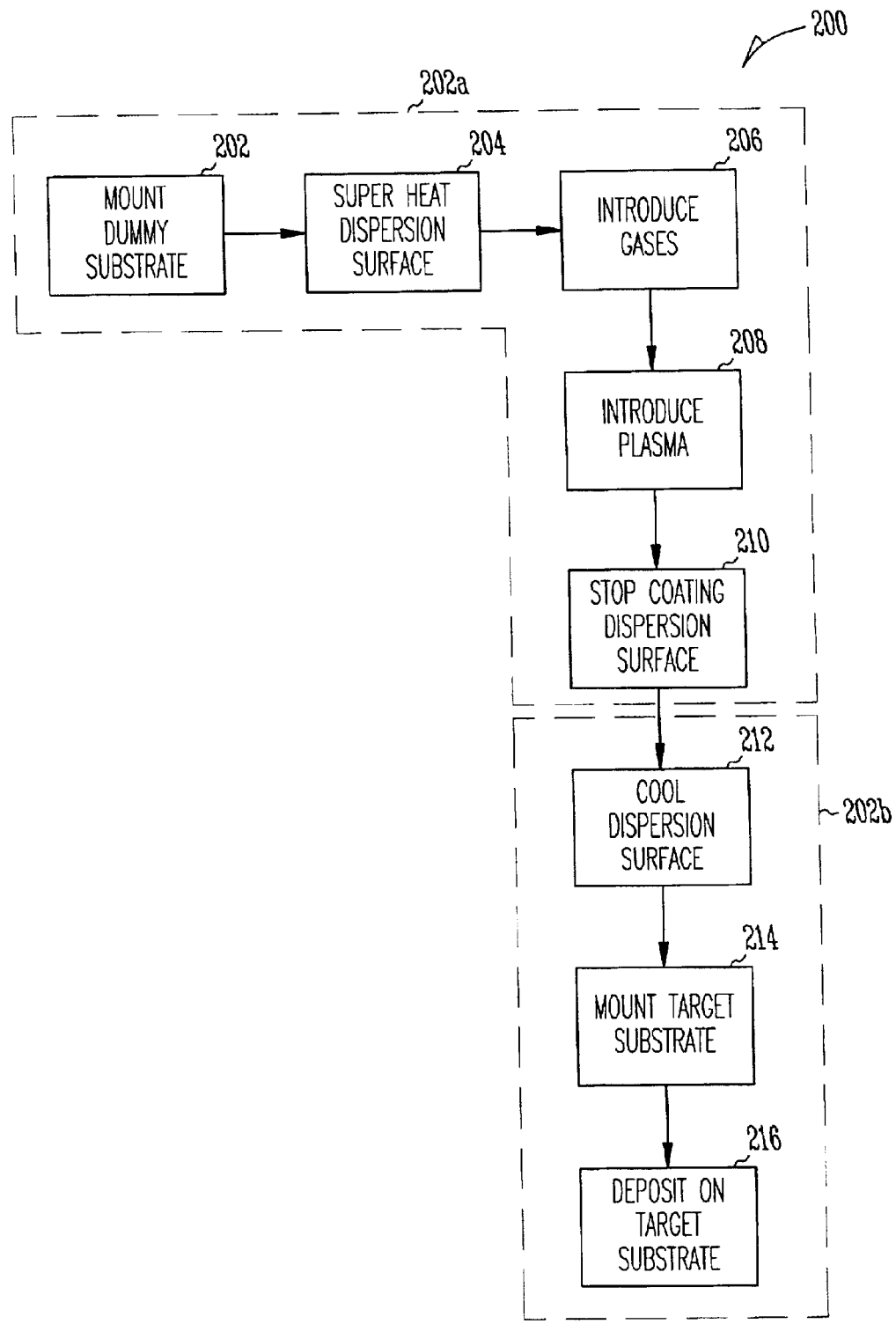
FIG. 2 is a flow chart of an exemplary method of an exemplary method of operating system 100.

The following detailed description, which references and incorporates FIGS. 1 and 2, describes and illustrates specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

FIG. 1 is a simple sectional diagram of an exemplary chemical-vapor-deposition (CVD) system 100. System 100 includes a chamber 110, gas sourcing system 120, plasma source 130, and a exhaust system 140. Chamber 110 includes a gas-dispersion fixture (or more generally apparatus) 112, a heated substrate holder (susceptor) 116. Gas-dispersion fixture 112, which includes a dispersion surface 113 that comprises holes, or apertures, 114, disperses one or more gases from gas sources 120 toward a substrate (wafer or integrated-circuit assembly) 150 on substrate holder 114. (As used herein, the term "substrate" encompasses a semiconductor wafer as well as structures having one or more insulative, semi-insulative, conductive, or semi-conductive layers and materials. Thus, for example, the term embraces silicon-on-insulator, silicon-on-sapphire, and other advanced structures.) Plasma source 130 introduces high-frequency electromagnetic energy into chamber 110 to facilitate reactions within the chamber.

The exemplary embodiment uses a commercial CVD chamber which provides a gas-dispersion fixture in the form of a showerhead. However, the invention is not limited to any particular chamber geometry or structure or gas-dispersion fixture geometry or structure. Indeed, it is believed that the invention is applicable to any CVD system having a gas-dispersion fixture. Thus, for example, other embodiments use horizontal CVD systems, low-and high-pressure CVD systems, and hot-and cold-wall CVD systems.

FIG. 2 includes a flow chart 200 that shows two exemplary operating modes for system 100. Flow chart 200 includes process blocks 202–216, with blocks 202–212 illustrating an exemplary fixture-conditioning mode 200a and blocks 212–216 illustrating an exemplary normal-deposition mode 200b.

As block 202 shows, fixture-conditioning operating mode 202a begins with a user or wafer-transport system (not shown) placing or mounting a dummy substrate 150 onto substrate holder 116. Execution of the exemplary operating mode then proceeds to block 204.

In block 204, system 100 heats dispersion surface 113 to a conditioning temperature which is greater than a deposition temperature in normal-deposition mode 200b. The exemplary embodiment heats dispersion surface 113 to a conditioning temperature at least 5–10% greater than that conventionally used for deposition of Ti—Al—Cl—N on dispersion surface 113. However, for many other compositions, the inventor expects that the conditioning temperature to be about 10–15%, 15–20%, 20–25%, 25–30%, 30–35%, 35–40%, 40–45%, 45–50% greater than the normal deposition temperature. It is believed that the teachings of this document will enable one of ordinary skill in the art to ascertain, without undue experimentation, an effective conditioning temperature or range of such temperatures for any material composition that can be deposited through chemical vapor deposition.

In the exemplary embodiment, the desired conditioning temperature is established by moving substrate holder 116 to a distance less than one centimeter, for example 300 mils, from dispersion surface 113 and then controlling a heater in the substrate holder. FIG. 1 shows this position as a fixture-conditioning position 116a.

Some other embodiments use other methods of heating dispersion surface 113 to a higher-than-normal temperature. For example, some embodiments move the dispersion surface closer to the substrate holder, and other embodiments use heat sources external to substrate holder, such as incandescent lighting or a heater internal to or attached to the gas-dispersion fixture. Thus, the invention is not limited to any particular method or structure for heating the dispersion surface to the conditioning temperature.

After establishing a desired conditioning temperature, execution proceeds to block 206, which entails introducing one or more gases to form material layer 115 on dispersion surface 113. The exemplary embodiment conventionally forms a titanium-aluminum-chlorine-nitrogen (Ti—Al—Cl—N) layer.

Block 208 shows that system 100 also operates plasma source 140 to introduce a plasma into chamber 110 to further facilitate formation of material layer 115. The exemplary embodiment introduces plasma power in excess of 400 Watts to further heat dispersion surface 113, thereby further enhancing properties of the resultant layer on the dispersion surface.

Block 210 entails stopping formation of material layer 115 and removing dummy substrate 150. Dummy substrate 150 can be discarded or reused for reconditioning fixture 112 or another fixture using the exemplary method or another incorporating teachings of the present invention.

In block 212, system 100 reduces the temperature of dispersion surface 113. In the exemplary embodiment, this entails moving substrate holder 116 to normal-deposition position 116b and/or curtailing or ending the introduction of plasma. Other embodiments reduce the temperature through control of heaters external to substrate holder 116.

Next as block 214 shows, a target substrate is placed or mounted on substrate holder 116. The exemplary embodiment places the substrate manually or automatically on the substrate holder. For convenience, FIG. 1 shows the target substrate as substrate 150.

Block 216 entails forming or depositing a material layer 152 on a target substrate, such as substrate 150. In the exemplary embodiment, this entails introducing one or more gases and/or a plasma to form a Ti—Al—Cl—N layer, which is the same composition as that on layer 115 on dispersion surface 113. However, there may be instances where a material layer of different composition than that on the gas-dispersion fixture is desirable.

After completion of this layer, other methods and materials can be used on substrate 150 to form a complete integrated circuit, such as a computer processor or memory circuit.

Conclusion

In furtherance of the art, the inventor has presented new procedures for conditioning gas-dispersion fixtures in chemical-vapor-deposition chambers. One exemplary procedure, in accord with the invention, entails heating at least a portion of a gas-dispersion fixture, such as a showerhead, to a temperature greater than its temperature during normal deposition operations and then passing one or more gases through the fixture to form a coating on it. The high conditioning temperature promotes uniform coating thickness and coating adhesion to the fixture. These in turn promote uniform chemical vapor depositions and reduce the likelihood of coating particles falling onto underlying substrates and causing integrated-circuit defects.

The embodiments described above are intended only to illustrate and teach one or more ways of practicing or implementing the present invention, not to restrict its breadth or scope. The scope of the invention intended to encompass all ways of practicing or implementing the principles of the invention, is defined only by the following claims and their equivalents.

What is claimed is:

1. A method of operating a chemical-vapor-deposition system including a gas-dispersion fixture and having a normal deposition temperature for forming material layers of a predetermined composition, the method comprising:

forming a first material layer of the predetermined composition on the gas-dispersion fixture at a first nominal or average temperature which differs by more than 50 percent from the normal deposition temperature; and using the gas-dispersion fixture to form a second material layer of the predetermined composition on a substrate at the normal deposition temperature.

2. The method of conditioning a gas-dispersion fixture in a chemical-vapor-deposition system having a normal deposition temperature for forming material layers of a predetermined composition, the method comprising:

heating at least a portion of the gas dispersion fixture to a temperature greater than the normal deposition temperature;

forming a material layer of the predetermined composition on at least the portion of the gas-dispersion fixture;

wherein the chemical-vapor-deposition system includes a heated substrate holder, with the heated substrate holder having a normal position relative to the gas-dipersion fixture to form material layers of the predetermined composition; and wherein heating at least a portion of the gas-dispersion fixture to a temperature greater than the normal deposition temperature comprises moving the fixture closer to the heated substrate holder than its normal position.

3. The method of claim 2, wherein moving the fixture in closer to the heated substrate holder than its normal position comprises moving the fixture within 300 mils of the substrate holder.

4. The method of claim 2, wherein the material layer consists essentially of titanium, aluminum, chlorine, and nitrogen atoms.

5. The method of conditioning a gas-dispersion fixture in a chemical-vapor-deposition system having a normal deposition temperature for forming material layers of a predetermined composition, the method comprising:

heating at least a portion of the gas-dispersion fixture to a temperature greater than the normal deposition temperature; and forming a material layer of the predetermined composition on at least the portion of the gas-dispersion fixture; and introducing a plasma power of over 400 watts near the gas-dispersion fixture.

6. A method of forming a layer in an intergrated circuit, comprising:

conditioning a gas-deposition fixture in a chemical-vapor-deposition system having a normal deposition temperature for forming material layers of a predetermined composition, wherein conditioning comprises:

heating at least a portion of the gas-dispersion fixture to a temperature greater than the normal deposition temperature by at least ten percent; and forming a material layer of the predetermined composition on at least the portion of the gas-dispersion fixture; and using the gas-dispersion fixture to form the layer in the intergrated circuit, wherein the material layer consists essentially of titanium, aluminum, chlorine, and nitrogen atoms.

7. A method of forming a layer in a intergrated circuit, comprising:

conditioning a gas-dispersion fixture in a chemical-vapor-deposition system having a normal deposition temperature for forming material layers of predetermined composition, wherein conditioning comprises:

heating at least a portion of the gas-dispersion fixture to a temperature greater than the normal deposition temperature by at least ten percent; and forming a material layer of the predetermined composition on at least the portion of gas-dispersion fixture; and using the gas-dispersion fixture to form the layer in the intergrated circuit, wherein the material layer comprises titanium.

8. A method of forming a layer on surface of gas-dispersion fixture in a chemical-vapor-deposition system having a normal deposition temperature for forming material layers of a predetermined composition, the method comprising:

heating at least a portion of the surface of the gas-dispersion fixture to a temperature greater than normal deposition temperature by at least ten percent;

introducing one or more gases around the heated surface of the gas-dispersion fixture; and electrically exciting the one or more gases to create a plasma.

9. A method of conditioning a gas-dispersion fixture in a chemical-vapor-deposition system including a heated substrate holder, with the system having a normal deposition temperature for forming material layers of predetermined composition and the heated substrate holder having a first separation from the gas-dispersion fixture to form material layers of the predetermined composition, the method comprising:

establishing a second separation between the gas-dispersion fixture and the heated substrate holder, with the second separation being less than the first separation; and forming a material layer of the predetermined composition on at least the portion of the gas-dispersion fixture while the second separation is established.

10. The method of claim 9, wherein the material layer consists essentially of titanium, aluminum, chlorine, and nitrogen atoms.

11. The method of claim 9, wherein the material layer comprises titanium.

12. A method of conditioning a gas-dispersion fixture in a chemical-vapor-deposition system including a heated substrate holder, with the system having a normal deposition temperature for forming material layers of a predetermined composition and the heated substrate holder having a first separation from the gas-dispersion fixture to form material layers of predetermined composition, the method comprising:

establishing a second separation between the gas-dispersion fixture and the heated substrate holder, with the second separation being less than the first separation;

operating the heated substrate holder to heat at least a portion of the gas-dispersion fixture to a temperature greater than normal deposition temperature; and forming a material layer of the predetermined composition on at least the portion of the gas-dispersion fixture while the second separation is established and while the portion of the gas-dispersion fixture has a temperature greater than the normal deposition temperature.

13. The method of claim 12, wherein the material layer consists essentially of titanium, aluminum, chlorine, and nitrogen atoms.

14. The method of claim 12, wherein the material layer comprises titanium.

15. A method of conditioning a gas-dispersion fixture in a chemical-vapor-deposited system including a heated substrate holder, with the system having a normal deposited temperature for forming material layers of the predetermined composition and the heated substrate holder having a first separation from the gas-dispersion fixture to form material layers of the predetermined composition, the method comprising:

establishing a second separation between the gas-dispersion fixture and the heated substrate holder, with the second separation being less than the first separation;

operating the heated substrate holder to heat at least a portion of the gas-dispersion fixture to a temperature greater than the normal deposition temperature;

forming a material layer of the predetermined composition on at least the gas-dispersion fixture while the second separation is established and while the portion of the gas-dispersion fixture has a temperature greater than the normal deposition temperature, wherein forming the material layer comprises:
introducing one or more gases around the heated portion of the gas-dispersion fixture; and
electrically exciting the one or more gases.

16. The method of claim 15, wherein operating the second separation occurs prior to operating the heated substrate holder to heat the portion of the gas-dispersion fixture and wherein forming the material layer occurs after operating the heated substrate holder.

17. The method of claim 15, wherein the material layer consists essentially of titanium, aluminum, chlorine, and nitrogen atoms.

18. The method of claim 15, wherein the material layer comprises titanium.

19. A method of conditioning a showerhead in a chemical-vapor-deposition system including a heated substrate holder, with the system having a normal deposition temperature for forming material layers of predetermined composition and the heated substrate holder having a first separation from the showerhead to form material layers of the predetermined composition, the method comprising:
establishing a second separation between the showerhead and the heated substrate holder, with the second separation being less than the first separation;
operating the heated substrate holder to heat a portion of the showerhead to a temperature greater than the normal deposition temperature;
forming a material layer of the predetermined composition on at least the portion of the showerhead while the second separation is established and while the portion of the showerhead has a temperature greater than the normal deposition temperature; wherein forming the material layer comprises:
introducing one or more gases around the heated portion of the showerhead; and
electrically exciting the one or more gases to create a plasma.

20. The method of claim 19, wherein operating the second separation occurs prior to operating the heated substrate holder to heat the portion of the showerhead and wherein forming the material layer occurs after operating the heated substrate holder.

21. The method of claim 19, wherein heating occurs before forming the material layer.

22. The method of claim 19, wherein the second separation is less than or equal to 300 mils.

23. The method of claim 19, wherein the plasma has a power greater than about 400 watts.

24. The method of claim 19, wherein forming the material layer of the predetermined composition on at least the portion of the gas-dispersion fixture, comprises passing one or more through the gas-dispersion fixture.

25. The method of claim 19, wherein the material layer consist essentially of titanium, aluminum, chlorine, and nitrogen atoms.

26. A method of operating a chemical-vapor-deposition system including a gas-dispersion fixture and a heated substrate holder, with the system having a normal deposition temperature for forming material layers of predetermined composition and the heated substrate holder having a first separation from the gas-dispersion fixture to from material layers of the predetermined composition, the method comprising:
establishing a second separation between the gas-dispersion fixture and the heated substrate holder, with the second separation being less the first separation; and
operating the heated substrate holder to heat at least a portion of the gas-dispersion fixture to a temperature greater than the normal deposition temperature;
forming a material layer of the predetermined composition on at least the portion of the gas-dispersion fixture while the second separation is established and while the portion of the gas-dispersion fixture has a temperature greater than the normal deposition temperature, wherein forming the material layer comprises:
introducing one ore more gases around the heated portion of the gas-dispersion fixture; and
electrically exciting the one or more gases to create a plasma;
re-establishing the first separation between the gas-dispersion fixture and the heated substrate holder;
placing a substrate on the heated substrate holder;
heating the substrate to normal deposition temperature; and
forming a material layer of the predetermined composition on at least a portion of the substrate at the normal deposition temperature.

27. A method of operating a chemical-vapor-deposition system including a gas-dispersion fixture and a heated substrate holder, with the system having a normal deposition temperature for forming material layers of predetermined composition and the heated substrate holder having a first separation from the gas-dispersion fixture to from material layers of the predetermined composition, the method comprising:
establishing a second separation between the gas-dispersion fixture and the heated substrate holder, with the second separation being less the first separation;
operating the heated substrate holder to heat at least a portion of the gas-dispersion fixture to a temperature greater than the normal deposition temperature;
forming a material layer of the predetermined composition on at least the portion of the gas-dispersion fixture while the second separation is established and while the portion of the gas-dispersion fixture has a temperature greater than the normal deposition temperature by at least 20 percent, wherein forming the material layer comprises:
introducing one or more gases around the heated portion of the gas-dispersion fixture; and
electrically exciting the one or more gases to create a plasma;
re-establishing the first separation between the gas-dispersion fixture and the heated substrate holder;
placing a substrate on the heated substrate holder;
heating the substrate to the normal deposition temperature; and
forming a material layer of the predetermined composition on at least a portion of the substrate at the normal deposition temperature.

28. In a chemical-vapor-deposition system including a susceptor and a gas-dispersion fixture and having a normal deposition temperature and a normal separation between the susceptor and the gas-dispersion fixture for forming material layers of a predetermined composition, a method of improving adhesion characteristics of a material layer of the predetermined composition to a surface of the gas-dispersion fixture, the method comprising:
heating at least a portion of the surface of the gas-dispersion fixture to a temperature greater than the normal deposition temperature; and
establishing a separation between the susceptor and the gas-dispersion fixture, which is less than the normal separation.

* * * * *

UNITED STATES PATENT AND TRADEMARK OFFICE
CERTIFICATE OF CORRECTION

PATENT NO. : 6,756,088 B2
DATED : June 29, 2004
INVENTOR(S) : Sharan

It is certified that error appears in the above-identified patent and that said Letters Patent is hereby corrected as shown below:

Column 4,
Line 59, delete "The" and insert -- A --, therefor.
Line 63, delete "gas dispersion" and insert -- gas-dispersion --, therefor.

Column 5,
Line 4, delete "dipersion" and insert -- dispersion --, therefor.
Line 10, after "fixture" delete "in".
Line 16, delete "The" and insert -- A --, therefor.
Line 29, delete "intergrated" and insert -- integrated --, therefor.
Line 31, delete "gas-deposition" and insert -- gas-dispersion --, therefor.
Line 42, delete "intergrated" and insert -- integrated --, therefor.
Line 45, delete "a intergrated" and insert -- an integrated --, therefor.
Line 49, after "of" insert -- a --.
Line 55, after "of" insert -- the --.
Line 58, delete "intergrated" and insert -- integrated --, therefor.
Line 60, after "on" insert -- a --.
Line 60, after "or" insert -- a --.
Line 66, after "than" insert -- the --.

Column 6,
Line 8, after "of" insert -- a --.
Line 31, after "of" insert -- the --.
Line 39, after "than" insert -- the --.
Line 51, delete "deposited" and insert -- deposition --, therefor.
Line 52, delete "deposited" and insert -- deposition --, therefor.
Line 53, after "of" delete "the" and insert -- a --, therefor.
Line 66, insert -- portion of the -- before "gas-dispersion".

Column 7,
Line 18, after "of" insert -- a --.
Line 25, after "heat" insert -- at least --.
Line 31, after "temperature" delete ";" and insert -- , --, therefor.
Line 50, after "more" insert -- gases --.
Line 52, delete "consist" and insert -- consists --, therefor.
Line 56, after "of" insert -- a --.
Line 58, after "to" delete "from" and insert -- form --, therefor.
Line 63, after "less" insert -- than --.
Line 64, delete "and".

UNITED STATES PATENT AND TRADEMARK OFFICE
CERTIFICATE OF CORRECTION

PATENT NO. : 6,756,088 B2
DATED : June 29, 2004
INVENTOR(S) : Sharan

It is certified that error appears in the above-identified patent and that said Letters Patent is hereby corrected as shown below:

Column 8,
Line 7, delete "ore" and insert -- or --, therefor.
Line 14, after "to" insert -- the --.
Line 22, after "of" insert -- a --.
Line 24, delete "from" and insert -- form --, therefor.
Line 29, after "less" insert -- than --.

Signed and Sealed this

Eighth Day of February, 2005

JON W. DUDAS
*Director of the United States Patent and Trademark Office*